(12) United States Patent
Zhou

(10) Patent No.: US 9,349,632 B2
(45) Date of Patent: May 24, 2016

(54) ISOLATION TRENCH FILL USING OXIDE LINER AND NITRIDE ETCH BACK TECHNIQUE WITH DUAL TRENCH DEPTH CAPABILITY

(71) Applicant: MICRON TECHNOLOGY, INC., Boise, ID (US)

(72) Inventor: Xianfeng Zhou, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/589,432

(22) Filed: Jan. 5, 2015

(65) Prior Publication Data
US 2015/0194336 A1    Jul. 9, 2015

Related U.S. Application Data

(60) Continuation of application No. 12/712,401, filed on Feb. 25, 2010, now Pat. No. 8,952,485, which is a division of application No. 11/374,000, filed on Mar. 14, 2006, now Pat. No. 7,691,722.

(51) Int. Cl.
*H01L 21/762* (2006.01)
*H01L 21/3105* (2006.01)
*H01L 21/311* (2006.01)
*H01L 29/06* (2006.01)

(52) U.S. Cl.
CPC ........ *H01L 21/76229* (2013.01); *H01L 21/311* (2013.01); *H01L 21/31051* (2013.01); *H01L 29/0649* (2013.01)

(58) Field of Classification Search
CPC .............. H01L 21/76229; H01L 29/0649; H01L 21/311; H01L 21/31051
USPC .......... 257/510, E21.545, E21.546; 438/424, 438/426, 427, 631, 697, 698, 699, 700, 759, 438/760
See application file for complete search history.

(56) References Cited

U.S. PATENT DOCUMENTS

| | | | |
|---|---|---|---|
| 6,531,377 B2 | 3/2003 | Knorr et al. |
| 6,624,022 B1 | 9/2003 | Hurley et al. |
| 6,642,125 B2 | 11/2003 | Oh et al. |
| 7,033,909 B2 | 4/2006 | Kim et al. |
| 7,332,408 B2 | 2/2008 | Violette |
| 2001/0036705 A1 | 11/2001 | Nishida et al. |
| 2002/0076900 A1 | 6/2002 | Park et al. |
| 2007/0212874 A1 | 9/2007 | Sandhu |

*Primary Examiner* — David Vu
(74) *Attorney, Agent, or Firm* — Wells St. John, P.S.

(57) ABSTRACT

An oxide layer is formed over a substrate having a smaller isolation trench and a large isolation trench. A nitride layer is formed over the oxide layer such that it completely fills the smaller isolation trench and lines the larger isolation trench. The nitride layer is etched back to form a recess in the nitride layer in the smaller isolation trench while at least a portion of the nitride layer lining the larger isolation trench is completely removed. A layer of HDP oxide is deposited over the substrate, completely filling the smaller and larger isolation trenches. The HDP oxide layer is planarized to the upper surface of the substrate. The deeper larger isolation trench may be formed by performing an etching step after the nitride layer has been etched back, prior to depositing HDP oxide.

12 Claims, 7 Drawing Sheets

ISOLATION TRENCH FILL USING OXIDE LINER AND NITRIDE ETCH BACK TECHNIQUE WITH DUAL TRENCH DEPTH CAPABILITY

CROSS REFERENCE TO RELATED APPLICATIONS

This application is a continuation of application Ser. No. 12/712,401, filed Feb. 25, 2010, which is a divisional of application Ser. No. 11/374,000, filed Mar. 14, 2006, which are hereby incorporated by reference in their entirety.

FIELD OF THE INVENTION

The present invention relates to semiconductor processing and, in particular, to a method of void-free filling of isolation trenches.

BACKGROUND OF THE INVENTION

With increasingly smaller dimension scaling in memory integrated circuit (IC) fabrication, filling deep isolation trenches, as may be used, for example, in FLASH memory structures, without voids has become more difficult. This is particularly true for isolation trenches that use a nitride liner with an HDP oxide fill. The addition of a nitride liner provides several benefits, including improved corner rounding at the bottom and sidewalls of the isolation trenches to decrease the occurrence of voids, reduced stress adjacent the trench isolation structure, and reduced electrical leakage. However, a nitride liner is typically a spin-on-dielectric (SOD). The SOD process leaves residual nitride materials in the vicinity of the active area. Nitrides at the active areas may cause a shift in electrical parameters and device reliability degradation.

Therefore, it is desirable to have a method of forming an isolation trench, including deep isolation trenches, that can exploit the conformal properties of nitride film without leaving nitride materials in the vicinity of the device's active areas.

BRIEF SUMMARY OF THE INVENTION

The invention provides a method of forming a void-free trench isolation structure having a nitride liner and HDP oxide fill. In an exemplary embodiment, an oxide layer is formed over a substrate having a smaller isolation trench and a larger isolation trench. For example, the smaller isolation trench may be for a memory array, while the larger isolation trench may be used for isolating the memory array from periphery circuitry. A nitride layer is formed over the oxide layer such that it completely fills the smaller isolation trench and lines the larger isolation trench. The nitride layer is etched back to form a recess in the nitride layer in the small isolation trench while the nitride layer lining the large isolation trench is completely removed. A layer of HDP oxide is deposited over the substrate, completely filling the smaller and larger isolation trenches. The HDP oxide layer is planarized to the upper surface of the substrate. A deeper larger isolation trench may be formed by performing an etching step in the larger isolation trench after the nitride layer has been removed, prior to depositing the HDP oxide.

DETAILED DESCRIPTION OF THE INVENTION

In the following detailed description, reference is made to various specific exemplary embodiments in which the invention may be practiced. These embodiments are described with sufficient detail to enable those skilled in the art to practice the invention, and it is to be understood that other embodiments may be employed, and that structural, logical, and electrical changes may be made.

The term "substrate" used in the following description may include any semiconductor-based structure that has a semiconductor surface. Substrate must be understood to include silicon, silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide.

Figure 1:
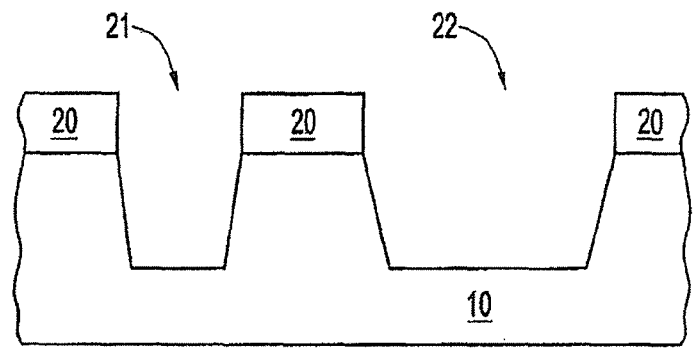
FIG. 1 is a cross-sectional view of an trench isolation structure of the present invention at an early stage of fabrication.

Referring now to the drawings, where like elements are designated by like reference numerals, FIGS. 1-10 illustrate a method of forming isolation trenches according to exemplary embodiments of the invention. FIG. 1 illustrates a semiconductor substrate 10 within which isolation trenches 21 and 22 have been formed by conventional methods. A pad nitride layer 20 lies over the top surface of the semiconductor substrate 10 and the trenches are formed into layer 20 and the underlying substrate 10. Optionally, there may be a polyamorphous silicon layer between the pad nitride and the surface of the semiconductor substrate 10 (not shown). Isolation trenches 21 and 22 have the substantially the same depth in the semiconductor substrate 10, however isolation trench 21 is smaller (i.e., less volume and smaller width) than larger isolation trench 22. Small isolation trench 21 may be formed, for example, for an isolating structure in a memory array, while larger isolation trench 22 may be formed, for example, for an isolating structure in an adjacent periphery circuit.

Figure 2:
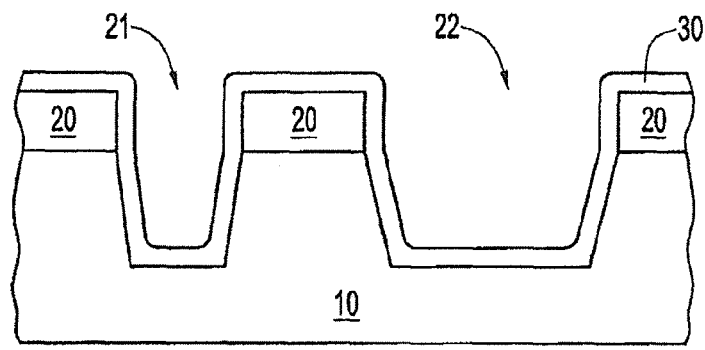
FIG. 2 is a cross-sectional view of the trench isolation structure of FIG. 1 at a subsequent stage of fabrication.

Referring now to FIG. 2, subsequent to the formation of the trenches 21, 22, an oxide liner 30 is formed over the substrate 10 to line the trenches 21, 22. The oxide liner 30 is deposited to isolate the active areas formed in the substrate 10 from nitrides that are deposited in subsequent processing steps. It should be noted that the sizes of the trenches are not of particular importance. However, the invention may be employed where one trench is smaller, relative to the larger trench, such that subsequent nitride deposition fills the smaller trench but only lines the bottom and sidewalls of the larger trench.

Figure 3:
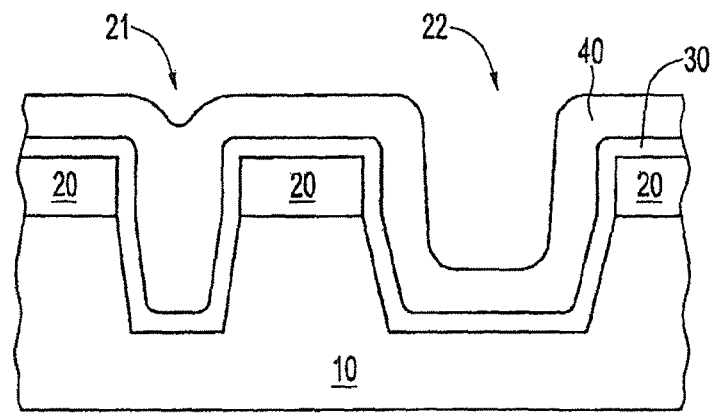
FIG. 3 is a cross-sectional view of the trench isolation structure of FIG. 2 at a subsequent stage of fabrication.
Figure 4:
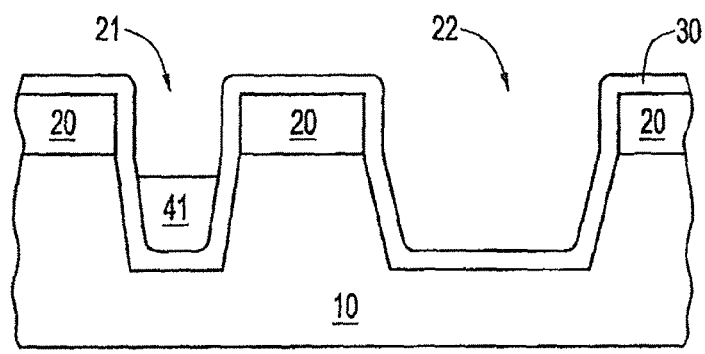
FIG. 4 is a cross-sectional view of the trench isolation structure of FIG. 3 at a subsequent stage of fabrication.

As shown in FIG. 3, a nitride layer 40 is deposited over the substrate 10, filling the small isolation trench 21 while only lining the large isolation trench 22. The nitride layer 40 aids in smoothing out the corners in the bottom of the trenches 21, 22 and in reducing the amount of stress in the dielectric used to subsequently fill in the trenches 21, 22. A nitride etch-back process is next performed to remove all, or a portion, of nitride material from the upper surface of the FIG. 3 structure and from the large isolation trench 22 and recess the nitride material in the small isolation trench 21 to a level below the top surface of the substrate 10, as shown in FIG. 4. The remaining nitride layer 41 is recessed to a depth sufficient to separate nitride material in remaining nitride layer 41 from any transisitor gates in the final memory array in the region of the small isolation trench 21. For example, for a FLASH memory array, the nitride material 41 is separated from any transistor floating gates which may be formed in active areas isolated by the trench 21.

Figure 5:
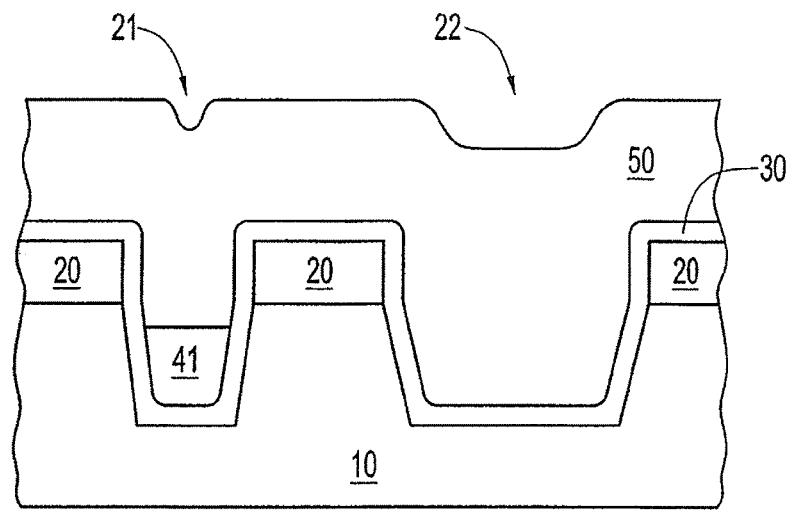
FIG. 5 is a cross-sectional view of the trench isolation structure of FIG. 4 at a subsequent stage of fabrication of a first embodiment of the present invention.
Figure 6:
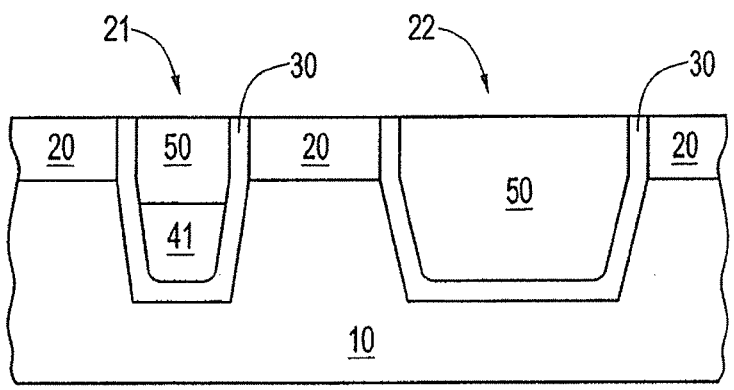
FIG. 6 is a cross-sectional view of the trench isolation structure of FIG. 5 at a subsequent stage of fabrication of the first embodiment of the present invention.

FIG. 5 shows a subsequent stage of fabrication where an HDP oxide material layer 50 is deposited over the substrate 10. The HDP oxide layer 50 fills the small isolation trench 21 and large isolation trench 22. A planarization process, such as chemical mechanical planarization (CMP), is then used to planarize the layers on the surface of the substrate 10, as shown in FIG. 6. The resulting structure is a void-free smaller trench isolation structure having a nitride liner and HDP oxide fill, without having nitride residue surrounding the trench isolation structure or nitride residue in peripheral isolation structures adjacent to the trench isolation structure.

Figure 7:
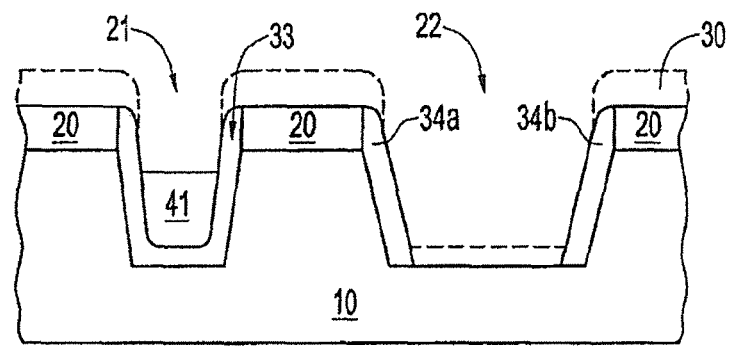
FIG. 7 is a cross-sectional view of the trench isolation structure of FIG. 6 at a subsequent stage of fabrication of a second embodiment of the present invention.

In another embodiment, a deeper trench may be formed in the periphery area, if desired. Initial steps of processing are used as shown in FIGS. 1-4. After the nitride layer 41 is recessed to the desired depth in the small isolation trench 21 and removed from the larger trench 22 and upper surfaces of the FIG. 3 structure, the oxide liner layer 30 is etched at the bottom of trench 22, as shown in FIG. 7. A reactive-ion etch process is used to etch back oxide liner layer 30, leaving an oxide liner 33 in the small isolation trench 21 and oxide spacers 34a, 34b on the sidewalls of the large isolation trench 22. The hashed lines in FIG. 7 illustrate the oxide liner 30 which is removed during the etching.

Figure 8:
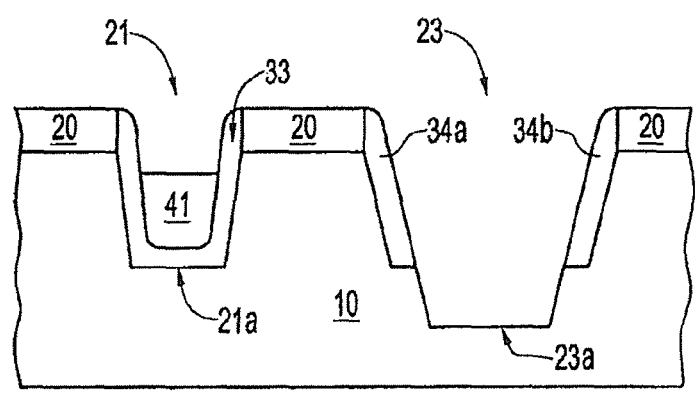
FIG. 8 is a cross-sectional view of the trench isolation structure of FIG. 7 at a subsequent stage of fabrication of the second embodiment of the present invention.

The substrate 10 then undergoes a selective silicon reactive-ion etch process, as shown in FIG. 8. The etch process forms a deep trench for the larger isolation trench 23, having a bottom 23a that is deeper into the silicon substrate 10 than the bottom 21a of the small isolation trench 21.

Figure 9:
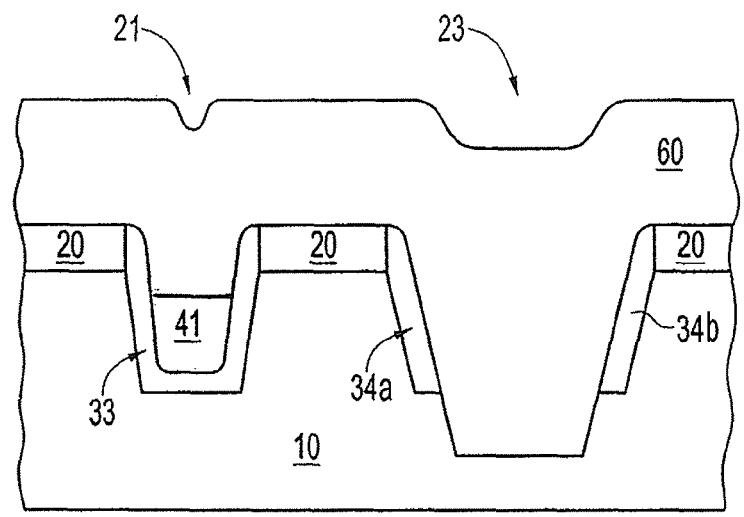
FIG. 9 is a cross-sectional view of the trench isolation structure of FIG. 8 at a subsequent stage of fabrication of the second embodiment of the present invention.
Figure 10:
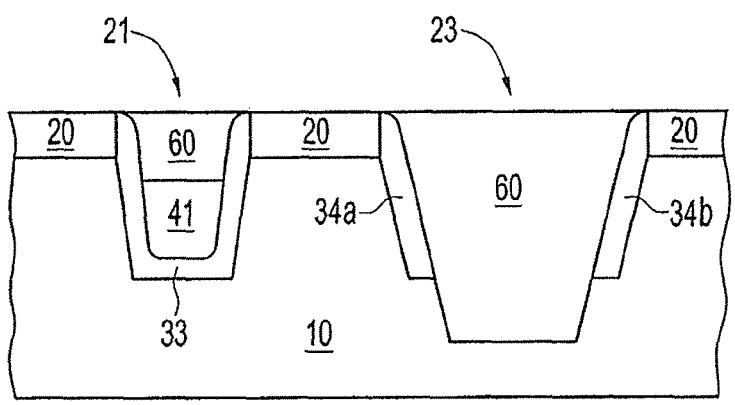
FIG. 10 is a cross-sectional view of the trench isolation structure of FIG. 9 at a subsequent stage of fabrication of the second embodiment of the present invention.

Referring now to FIG. 9, an HDP oxide material layer 60 is deposited over the substrate 10 to fill the small isolation trench 21 and deep isolation trench 23. A planarization process, such as CMP, is then used to planarize the surface of the substrate 10, as shown in FIG. 10.

The exemplary embodiments of the invention (described above) form larger and smaller void-free trench isolation structures, with nitride in the smaller trenches but without nitride residue surrounding the smaller trench isolation structures which may degrade devices constructed in the active areas of the substrate isolated by the smaller isolation trenches.

Although the invention has been described with reference to the formation of only two trench isolation structures, the invention also contemplates the formation of a multitude of larger and smaller isolation structures, having various depths, and located at various locations on the substrate to isolate devices. Further, although the invention has been described above with reference to a memory array and periphery circuitry, the invention also has applicability to other integrated circuits. For example, the invention may be used in flash memory with the smaller trenches isolating structures in the memory array and the larger trenches isolation structures elsewhere, such as the periphery, but can be used in any integrated circuit device where isolation is required.

Figure 11:
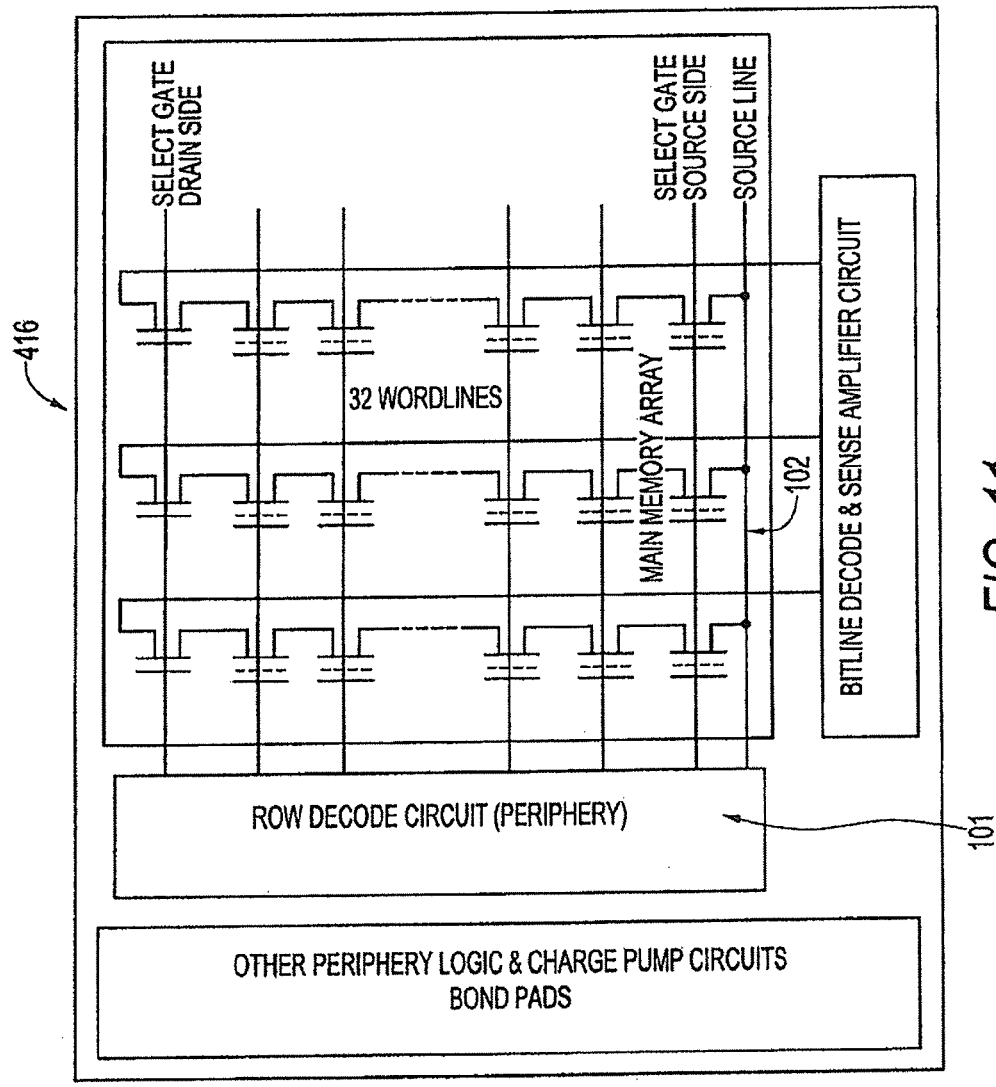
FIG. 11 is a diagram of an exemplary memory array employing an embodiment of the present invention.

FIG. 11 is a diagram of an exemplary FLASH memory device 416 employing an embodiment of the invention. Smaller trench isolation structures constructed in accordance with the invention may be formed to isolate a memory cell in the main memory array region 101 while a larger trench isolation structure may be formed in accordance with the invention to isolate the main memory array from the row decode circuit, or periphery, region 102.

Figure 12:
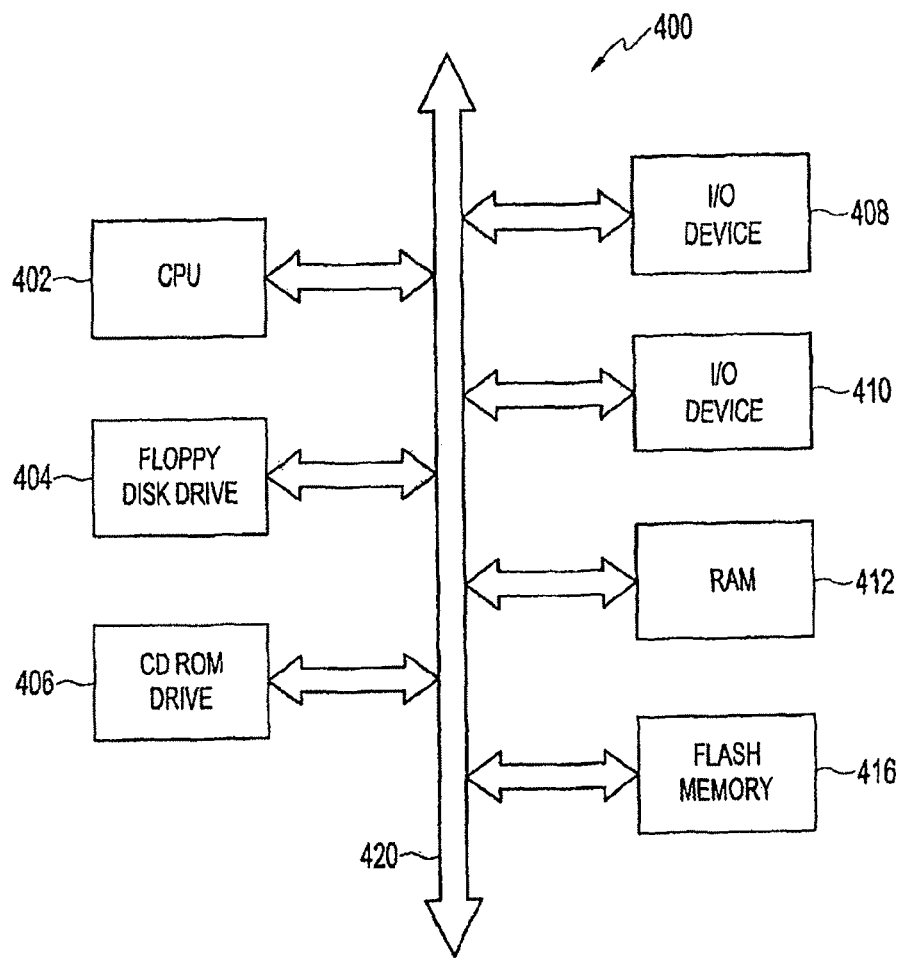
FIG. 12 is a block diagram of a processor system utilizing components constructed in accordance with the present invention.

FIG. 12 is a block diagram of a processor system 400 utilizing a flash memory device 416 constructed in accordance with the present invention. That is, the flash memory device 416 has cells separated by a trench isolation region constructed in accordance with the invention. The processor system 400 may be a computer system, a process control system or any other system employing a processor and associated memory. The system 400 includes a central processing unit (CPU) 402, e.g., a microprocessor, that communicates with the flash memory 416 and an I/O device 408 over a bus 420. It must be noted that the bus 420 may be a series of buses and bridges commonly used in a processor system, but for convenience purposes only, the bus 420 has been illustrated as a single bus. A second I/O device 410 is illustrated, but is not necessary to practice the invention. The processor system 400 also includes random access memory (RAM) device 412 and may include a read-only memory (ROM) device (not shown), and peripheral devices such as a floppy disk drive 404 and a compact disk (CD) ROM drive 406 that also communicate with the CPU 402 over the bus 420 as is well known in the art.

The above description and drawings are only to be considered illustrative of exemplary embodiments, which achieve the features and advantages of the invention. Modification and substitutions to specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. A method of forming a trench isolation structure in an integrated circuit comprising:

forming a smaller isolation trench and a larger isolation trench in a semiconductor substrate, wherein said larger isolation trench has a greater width than said smaller isolation trench and the same depth as the smaller isolation trench;

forming an oxide layer over said substrate and on all surfaces of said smaller and larger isolation trenches;

forming a nitride layer over said oxide layer, said nitride layer completely filling said smaller isolation trench, but only lining said larger isolation trench;

removing a portion of said nitride layer to form a recess in said nitride layer in said smaller isolation trench and to completely remove said nitride layer lining for said larger isolation trench; and forming a layer of high density plasma oxide over said substrate to fill said smaller and larger isolation trenches.

2. The method of claim 1, wherein said nitride layer is removed such that an upper surface of said nitride layer in said smaller isolation trench is below an upper surface of said semiconductor substrate.

3. The method of claim 1, further comprising the act of performing an oxide spacer etch on said oxide layer after removing said portion of said nitride layer to etch back said oxide layer, leaving an oxide liner in said smaller isolation trench and said large isolation trench.

4. The method of claim 1, further comprising the act of planarizing said high density plasma oxide.

5. The memory device of claim 1, further comprising forming a second nitride material directly above and proximate to said semiconductor material before forming said first and second trench isolation regions.

6. A method of forming a trench isolation structure in an integrated circuit comprising:

forming a first isolation trench and a second isolation trench in a semiconductor substrate, wherein said second isolation trench has a greater width than said first isolation trench and the same depth as the first isolation trench;

forming a nitride layer over said substrate such that said nitride layer completely fills said first isolation trench while only lining said second isolation trench;

removing a portion of said nitride layer to form a recess in said nitride layer in said first isolation trench; and forming an insulating layer of material over said substrate to fill said first and second isolation trenches.

7. The method of claim 6, wherein an upper surface of said nitride layer in said first isolation trench is below an upper surface of said semiconductor substrate.

8. The method of claim 6, further comprising the act of forming an oxide layer over said substrate and on all surfaces of said first and second isolation trenches prior to said act of forming a nitride layer.

9. The method of claim 8, further comprising the act of etching said oxide layer after removing said portion of said nitride layer to form an isolating liner in said first isolation trench and second isolation trench.

10. The method of claim 6, wherein said insulating layer is an HDP oxide layer.

11. The method of claim 6, further comprising the act of planarizing said insulating layer to an upper surface of said semiconductor substrate.

12. The method of claim 6, further comprising forming a second nitride material directly above and proximate to said semiconductor material before forming said first and second isolation trenches.

* * * * *